(12) United States Patent
Huang et al.

(10) Patent No.: US 8,748,283 B2
(45) Date of Patent: Jun. 10, 2014

(54) METHODS OF FORMING CAPACITORS AND SEMICONDUCTOR DEVICES INCLUDING A RUTILE TITANIUM DIOXIDE MATERIAL

(71) Applicant: Micron Technology, Inc., Boise, ID (US)

(72) Inventors: Tsai-Yu Huang, Taipei County (TW); Vishwanath Bhat, Boise, ID (US); Vassil Antonov, Boise, ID (US); Chun-I Hsieh, Boise, ID (US); Chris Carlson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/903,267

(22) Filed: May 28, 2013

(65) Prior Publication Data

US 2013/0260529 A1    Oct. 3, 2013

Related U.S. Application Data

(62) Division of application No. 13/021,910, filed on Feb. 7, 2011, now Pat. No. 8,564,095.

(51) Int. Cl.
*H01L 21/20*    (2006.01)

(52) U.S. Cl.
USPC .................................. 438/386; 257/E29.343

(58) Field of Classification Search
USPC .............. 438/386, 387, 381; 257/68, 71, 277, 257/296, 298, 300, 301, 303, 304, 306–313, 257/532, 534, 535, E27.016, E27.017, 257/E27.019–27.021, E27.023–E27.025, 257/E27.03, E27.031–E27.034, E27.048, 257/E27.037, E27.038, E27.042–E27.045, 257/E27.071, E27.087, E27.088, E27.09, 257/E27.092, E27.093, E27.095, 257/E29.343–E29.347, E21.647, E21.664
See application file for complete search history.

(56) References Cited

U.S. PATENT DOCUMENTS

| | | | |
|---|---|---|---|
| 4,200,474 A | 4/1980 | Morris | |
| 4,486,487 A | 12/1984 | Skarp | |
| 5,228,911 A | 7/1993 | Kunii et al. | |
| 6,156,606 A | 12/2000 | Michaelis | |
| 2003/0124875 A1 | 7/2003 | Kil | |

(Continued)

FOREIGN PATENT DOCUMENTS

| | | |
|---|---|---|
| JP | 2247904 A | 10/1990 |
| JP | 2007110111 A | 4/2007 |
| WO | 2005063629 A1 | 7/2005 |

OTHER PUBLICATIONS

Kim et al, Al-Doped TiO2 Films with Ultralow Leakage Currents for Next Generation DRAM Capacitors, Adv. Mater., 2008, vol. 20, pp. 1429-1435.

(Continued)

*Primary Examiner* — Selim Ahmed
(74) *Attorney, Agent, or Firm* — TraskBritt

(57) ABSTRACT

Methods of forming a capacitor including forming at least one aperture in a support material, forming a titanium nitride material within the at least one aperture, forming a ruthenium material within the at least one aperture over the titanium nitride material, and forming a first conductive material over the ruthenium material within the at least one aperture. The support material may then be removed and the titanium nitride material may be oxidized to form a titanium dioxide material. A second conductive material may then be formed over an outer surface of the titanium dioxide material.

21 Claims, 6 Drawing Sheets

(56) References Cited

U.S. PATENT DOCUMENTS

| | | |
|---|---|---|
| 2005/0141168 A1* | 6/2005 | Lee et al. .................. 361/306.3 |
| 2006/0134433 A1 | 6/2006 | Maula et al. |
| 2007/0024189 A1 | 2/2007 | Yamamoto et al. |
| 2007/0054044 A1 | 3/2007 | Shimosaki et al. |
| 2008/0087890 A1 | 4/2008 | Ahn et al. |
| 2008/0157278 A1* | 7/2008 | Do et al. ...................... 257/532 |
| 2008/0182408 A1 | 7/2008 | Lee et al. |
| 2009/0065896 A1 | 3/2009 | Hwang |
| 2009/0230510 A1 | 9/2009 | Miki et al. |
| 2009/0257170 A1* | 10/2009 | Bhat et al. .................... 361/311 |
| 2009/0273882 A1* | 11/2009 | Park et al. .................... 361/305 |
| 2009/0289327 A1 | 11/2009 | Fujiwara |
| 2009/0311521 A1 | 12/2009 | Nikolov et al. |
| 2010/0044771 A1 | 2/2010 | Ahn et al. |
| 2010/0255652 A1 | 10/2010 | Tanioku |
| 2012/0199944 A1 | 8/2012 | Huang et al. |
| 2012/0202356 A1 | 8/2012 | Huang et al. |

OTHER PUBLICATIONS

Lindgren, Torbjorn, et al., "Photoelectrochemical and Optical Properties of Nitrogen Doped Titanium Dioxide Films, Prepared by Reactive DC Magnetron Sputtering," J. Phys. Chem. B 2003, 107, Jan. 28, 2003, pp. 5709-5716.

Liu, Hongyan, et al., "(Sulfur,Nitrogen)-Codoped Rutile-Titanium Dioxide as a Visible-Light-Activated Photocatalyst," J. Am. Ceram. Soc., 87[8], Mar. 8, 2004, pp. 1582-1584.

International Search Report, International Application No. PCT/US2012/022766, mailed Sep. 25, 2012, three (3) pages.

International Written Opinion of the International Searching Authority, International Application No. PCT/US2012/022766, mailed Sep. 25, 2012, four (4) pages.

\* cited by examiner

METHODS OF FORMING CAPACITORS AND SEMICONDUCTOR DEVICES INCLUDING A RUTILE TITANIUM DIOXIDE MATERIAL

CROSS-REFERENCE TO RELATED APPLICATIONS

This application is a divisional of U.S. patent application Ser. No. 13/021,910, filed Feb. 7, 2011, now U.S. Pat. No. 8,564,095, issued Oct. 22, 2013, the disclosure of which is incorporated herein in its entirety by reference.

The present application is also related to U.S. patent application Ser. No. 13/021,895, filed Feb. 7, 2011, now U.S. Pat. No. 8,609,553, issued Dec. 17, 2013, titled "METHODS OF FORMING RUTILE TITANIUM DIOXIDE AND METHODS OF FORMING SEMICONDUCTOR STRUCTURES COMPRISING SAME," the disclosure of which is incorporated herein in its entirety by reference.

TECHNICAL FIELD

Embodiments of the present disclosure relate to capacitors including rutile titanium dioxide. More specifically, the present disclosure, in various embodiments, relates to a method of forming a capacitor including rutile titanium dioxide, as well as to a resulting capacitor and to semiconductor devices incorporating such capacitors.

BACKGROUND

A memory cell, such as a dynamic random access memory (DRAM) cell, conventionally includes a charge storage capacitor coupled to an access device, such as a Metal-Oxide-Semiconductor Field Effect Transistor (MOSFET). The MOSFET functions to apply or remove charge on the capacitor, thus affecting a logical state defined by the stored charge. The conditions of DRAM operation, such as operating voltage, leakage rate and refresh rate, will, in general, mandate that a certain minimum charge be stored by the capacitor.

Capacitors include two conductors, such as parallel metal or polysilicon plates, which act as electrodes. The electrodes are insulated from each other by an interposed dielectric material. One type of capacitor used in DRAM cells is a metal-insulator-metal (MIM) capacitor. The dielectric constant, k, of the dielectric material (i.e., insulator material) in the capacitor is a crucial element for mass-producing DRAM cells. For example, a 3× nm DRAM cell or larger requires a dielectric material having a dielectric constant of at least about 55 in order to achieve the desired capacitance.

In certain capacitor configurations, such as pillar-type capacitors, ruthenium is deposited as a bottom electrode in direct contact with a polysilicon material, which functions as a sacrificial material in the pillar capacitor. The ruthenium and polysilicon may react, forming ruthenium silicide (RuSi). When RuSi is present at an interface between titanium dioxide ($TiO_2$) and the ruthenium, the RuSi may cause high current leakage of the capacitor, which decreases the efficiency of the capacitor.

Crystalline dielectric materials tend to have a higher dielectric constant than amorphous dielectric materials. For example, rutile titanium dioxide ($TiO_2$) has a dielectric constant of about 170 along the c-axis of the crystal structure and a dielectric constant of about 90 along the a-axis of the crystal structure, while amorphous $TiO_2$ has a dielectric constant of about 30. However, forming rutile $TiO_2$ often requires the use of high temperature processes. For example, anatase $TiO_2$ may be converted to rutile $TiO_2$ by annealing the $TiO_2$ at a temperature of at least about 800° C. However, such increased temperatures may cause damage to other components of the capacitor or device in which the capacitor is incorporated. Accordingly, low temperature methods of forming rutile $TiO_2$ for use in capacitors are desirable.

BRIEF DESCRIPTION OF THE SEVERAL VIEWS OF THE DRAWINGS

FIG. 1 is a partial cross-sectional view of a partially formed semiconductor device prior to fabrication of capacitors thereon.

FIG. 2 is a partial cross-sectional view similar to that of FIG. 1 illustrating the partially formed semiconductor device after forming holes therein.

FIG. 3 is a partial cross-sectional view similar to that of FIG. 2 illustrating the partially formed semiconductor device after forming a titanium nitride material thereon.

FIG. 4 is a partial cross-sectional view similar to that of FIG. 3 illustrating the partially formed semiconductor device after removing a portion of the titanium nitride material.

FIG. 5 is a partial cross-sectional view similar to that of FIG. 4 illustrating the partially formed semiconductor device after forming a ruthenium material thereon.

FIG. 6 is a partial cross-sectional view similar to that of FIG. 5 illustrating the partially formed semiconductor device after forming a conductive material thereon.

FIG. 7 is a partial cross-sectional view similar to that of FIG. 6 illustrating the partially formed semiconductor device after removing portions of the ruthenium material and the conductive material.

FIG. 8 is a partial cross-sectional view similar to that of FIG. 7 illustrating the partially formed semiconductor device after removing a mask material.

FIG. 9 is a partial cross-sectional view similar to that of FIG. 8 illustrating the partially formed semiconductor device after removing support material from the semiconductor device.

FIG. 10 is a partial cross-sectional view similar to that of FIG. 9 illustrating the partially formed semiconductor device after oxidizing the titanium nitride material.

FIG. 11 is a partial cross-sectional view similar to that of FIG. 10 illustrating the partially formed semiconductor device after forming a top electrode thereon.

DETAILED DESCRIPTION

Figure 1:
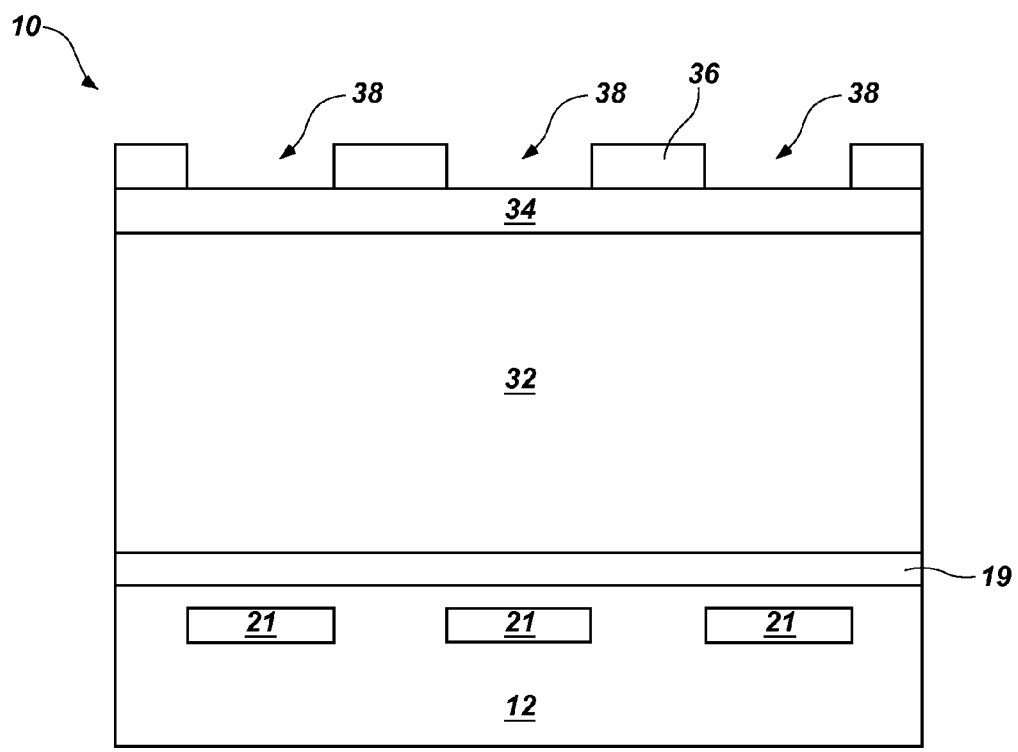
FIGS. 1 through 11 illustrate embodiments of methods of the present disclosure that may be used to form semiconductor devices that include at least one capacitor including a high-k dielectric material, and embodiments of semiconductor devices of the present disclosure that include such capacitors.

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided herein does not provide a complete process flow for manufacturing a capacitor or a DRAM device, and the capacitor and DRAM devices described below do not form a complete semiconductor device. Only those process acts and structures necessary to understand the embodiments of the present disclosure are described in detail below. Additional acts to form a complete semiconductor device including the capacitor or DRAM device may be performed by conventional techniques.

Methods of forming a capacitor including a high-k dielectric material are disclosed. In particular, the methods may be used to form a capacitor including rutile $TiO_2$. The capacitor may be a pillar capacitor structure.

The materials described herein may be formed by any suitable technique including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular high-k dielectric material, DRAM device, or system, but are merely idealized representations that are employed to describe embodiments of the present disclosure. The drawings presented herein are not necessarily drawn to scale. Additionally, elements common between drawings may retain the same numerical designation.

Embodiments of methods of the present disclosure that may be used to form capacitors including a high-k dielectric material are described below with reference to FIGS. 1 through 13.

FIG. 1 is a partial cross-sectional view of a partially formed semiconductor structure 10. The semiconductor structure 10 may be utilized in any type of semiconductor device that includes an integrated circuit having at least one capacitor therein, as described in further detail below. The capacitor may be a container capacitor. For example, the semiconductor device may be a memory device, an electronic signal processor device, or a device for capturing or acquiring an image.

The semiconductor structure 10 includes a substrate 12, which may comprise a wafer or other semiconductor substrate. A plurality of transistors 21 may be formed on and in a surface of the substrate 12. The transistors 21 may include, for example, complementary metal-oxide semiconductor (CMOS) transistors. Such transistors are known in the art and, therefore, are not described in detail herein.

Embodiments of the present disclosure are not limited by the form of the transistors 21, and the particular transistor structures, configuration, quantity, and location shown in the figures are provided as one non-limiting example of a semiconductor device that may embody the present disclosure as discussed in further detail below. Furthermore, embodiments of the present disclosure may not include transistors 21.

At least one capacitor may be formed on the semiconductor structure 10. With continued reference to FIG. 1, a support material 32 and a protective material 19 may be formed on the semiconductor structure 10 over the substrate 12 (e.g., over the transistors of the semiconductor structure 10), as shown in FIG. 1. The protective material 19 may function as a mask for various components of the substrate 12 as described in greater detail herein. In some embodiments, the protective material 19 may include a titanium nitride material. In additional embodiments, the protective material 19 may be omitted. The support material 32 may be a dielectric material, a conductive material, or a semiconductive material. The support material 32 may include, for example, a material such as a phosphosilicate glass (PSG), a borophosphosilicate glass (BPSG), carbon, or polysilicon (doped or undoped). In one embodiment, the support material 32 is polysilicon. A dielectric material 34 may be provided over the support material 32. The dielectric material 34 may be, for example, silicon nitride ($Si_3N_4$). Other dielectric materials may also be used as the dielectric material 34. The dielectric material 34 may be any dielectric material that will not be removed from the semiconductor structure 10 upon removal of the underlying layer of support material 32, as discussed below.

A mask 36 may be provided over an exposed major surface of the dielectric material 34. The mask 36 includes apertures 38 that extend therethrough at selected locations over the semiconductor structure 10. The locations of the apertures 38 may be locations at which it is desired to form capacitors. The mask 36 may be, for example, an oxide or a photoresist.

Figure 2:
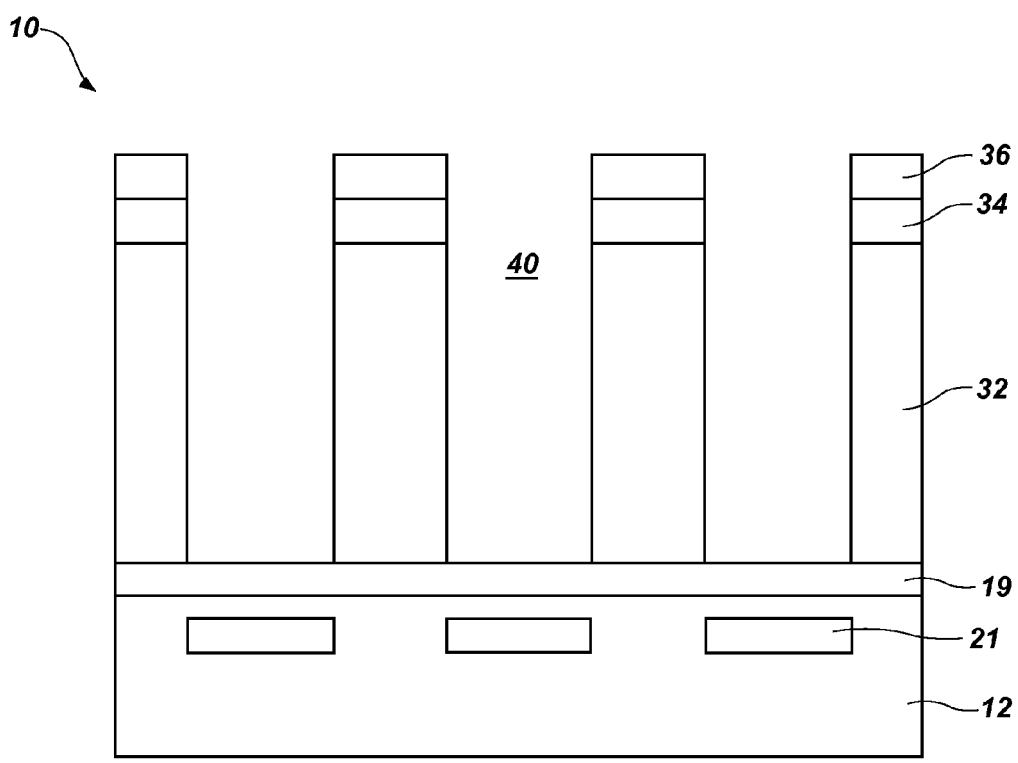

Referring to FIG. 2, holes 40 may be formed in the dielectric material 34 and the support material 32. The holes 40 may be formed by exposing the dielectric material 34 and the support material 32 to an etchant through the apertures 38 in the mask 36. For example, an anisotropic plasma etching process may be used to form the holes 40 in the dielectric material 34 and the support material 32 through the apertures 38 in the mask 36. The processing parameters for such an anisotropic plasma etching process will depend upon the materials used as the dielectric material 34 and the support material 32, and various anisotropic plasma etching processes are known in the art for many materials that may be used for the support material 32.

Figure 3:
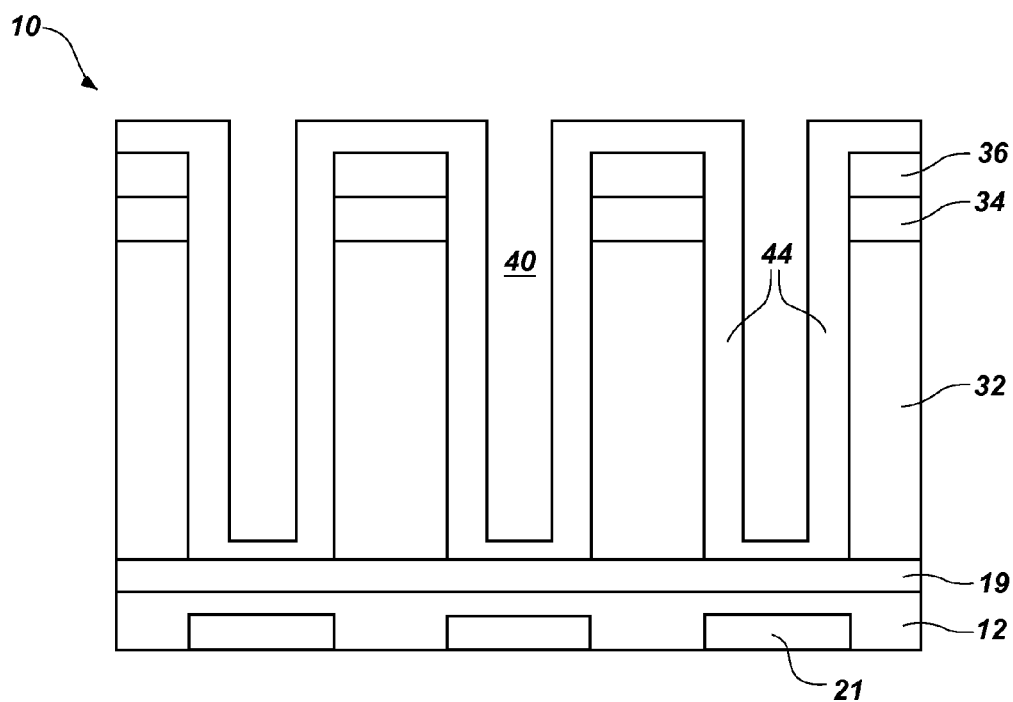

As shown in FIG. 3, a titanium nitride material 44 may be formed on the semiconductor structure 10 such that the titanium nitride material 44 is disposed on the surfaces of the semiconductor structure 10 within the holes 40. The titanium nitride material 44 may line the holes 40. For example, the titanium nitride material 44 may be deposited on or formed on the semiconductor structure 10 as a thin conformal layer.

The titanium nitride material 44 may be formed on the semiconductor structure 10 using, for example, a chemical vapor deposition (CVD) process or an atomic layer deposition (ALD) process. A layer of the titanium nitride (TiN) material 44 may be formed, for example, using a CVD process by flowing titanium tetrachloride ($TiCl_4$) and ammonia ($NH_3$), or by using an ALD process. CVD and ALD processes of forming TiN are known in the art and, therefore, details are not provided herein.

As a non-limiting example, the titanium nitride material 44 may have an average thickness of between about five nanometers (5 nm) and about twenty nanometers (20 nm).

Figure 4:
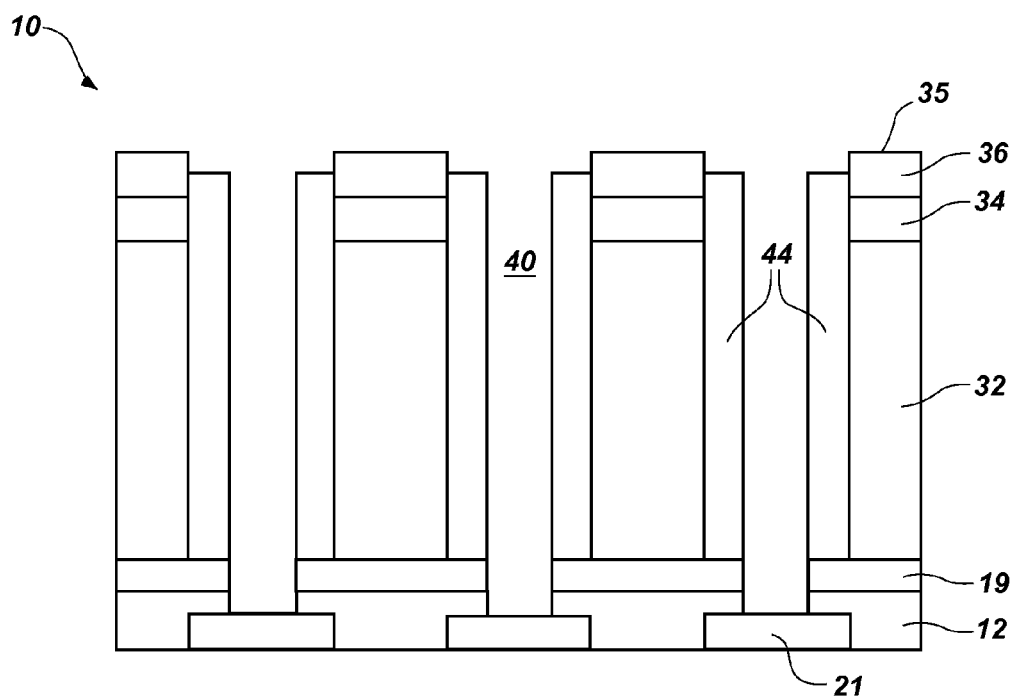

Referring to FIG. 4, the titanium nitride material 44 disposed on an exposed major surface 35 of the mask 36 outside the holes 40 may be removed. The titanium nitride material 44, the protective material 19 (if present) and a portion of the substrate 12 may also be removed from a bottom of the holes 40 to expose at least one of the transistors 21 at the bottom of the hole 40. Alternatively, in some embodiments, the titanium nitride material 44 may remain in the bottom of the hole 40 such that the titanium nitride material 44 is in electrical communication with at least one of the transistors 21. The titanium nitride material 44, the protective material 19 and the portion of the substrate 12 at the bottom of the holes 40 may be removed using processes known in the art. For example, at least one of a spacer etch and punch process may be used to form the structure of FIG. 4.

Figure 5:
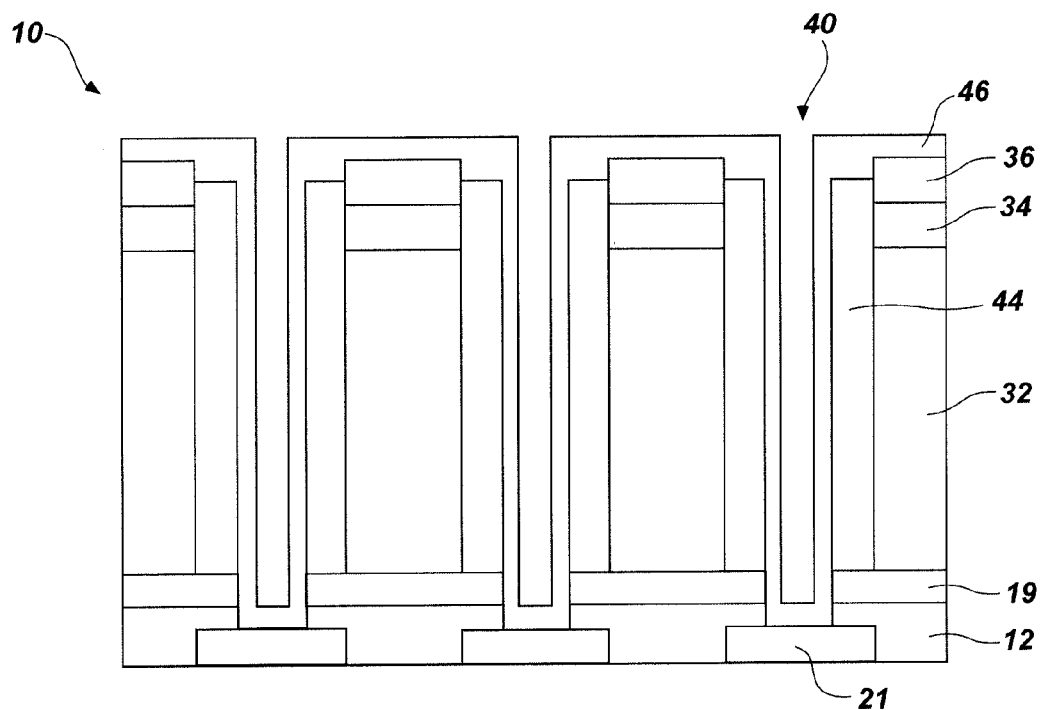

As shown in FIG. 5, a ruthenium (Ru) material 46 may be formed on the semiconductor structure 10 such that the ruthenium material 46 is disposed on the surfaces of the semiconductor structure 10 within the holes 40. The Ru material 46 may, for example, be formed as a conformal layer over the titanium nitride material 44. The Ru material 46 may be formed using methods known in the art including, for example, chemical vapor deposition and atomic layer deposition. While a Ru material 46 is described herein, other metals capable of forming a metal oxide that has a crystalline structure similar to the crystalline structure of rutile $TiO_2$ may be used in place of Ru material 46. For example, Mn, W, Cr, Sn, V, Pt, Ir, Pd, Rh, or Os may be used instead of Ru material 46. Because of the high cost of Ru, a thickness of the Ru material 46 may be relatively thin. For example, the Ru material 46 may have a thickness of between about five angstroms (5 Å) and about ten nanometers (10 nm). The Ru material 46 may be formed such that the Ru material 46 is in electrical communication with at least one of the transistors 21.

Figure 6:
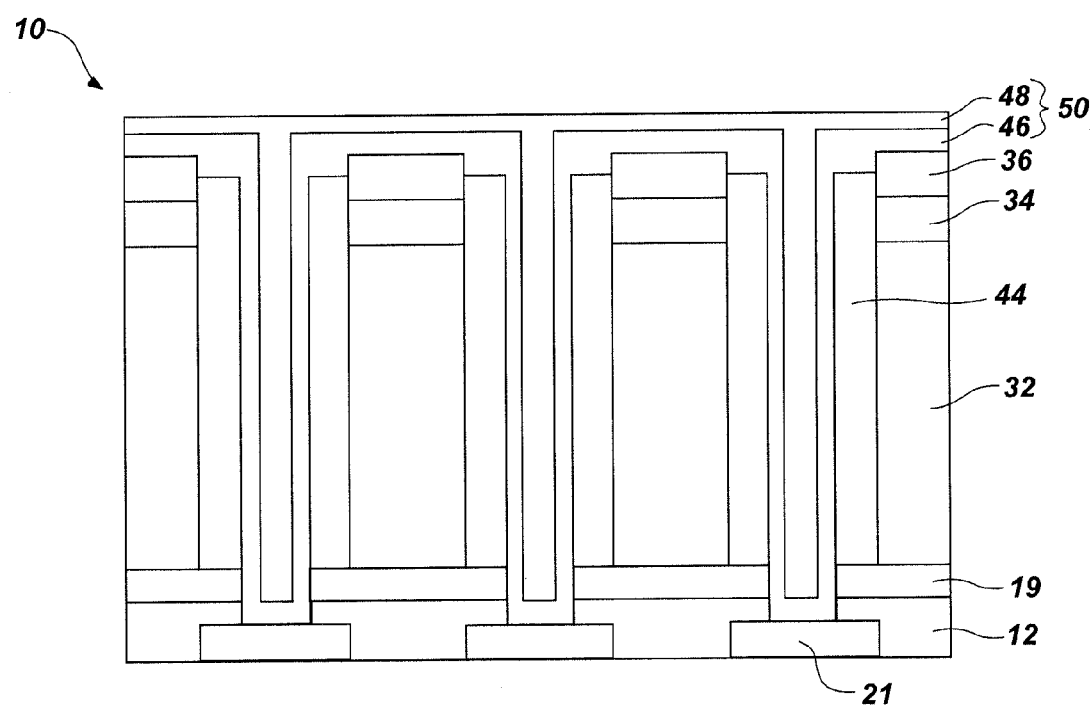

A conductive material 48 may be formed over the semiconductor structure 10 as shown in FIG. 6. The conductive material 48 may be conformally formed over the Ru material 46. The conductive material 48 may be formed on the Ru material 46 such that the conductive material 48 at least partially fills the holes 40. In one embodiment, the conductive material 48 may substantially fill the holes 40. The conductive material 48 may be any suitable conductive material including, but not limited to, metals, metal alloys, conductive metal oxides, and mixtures thereof. For example, the conductive material 48 may be formed of tungsten (W), nickel (Ni), tantalum nitride (TaN), platinum (Pt), tungsten nitride (WN), gold (Au), titanium nitride (TiN), titanium aluminum nitride (TiAlN), ruthenium (Ru), or ruthenium oxide ($RuO_2$). In one embodiment, the conductive material 48 is TiN. The conductive material 48 may be formed by any process known in the art including, for example, ALD and CVD. The conductive material 48 and the Ru material 46, in combination, form a bottom electrode 50.

Figure 7:
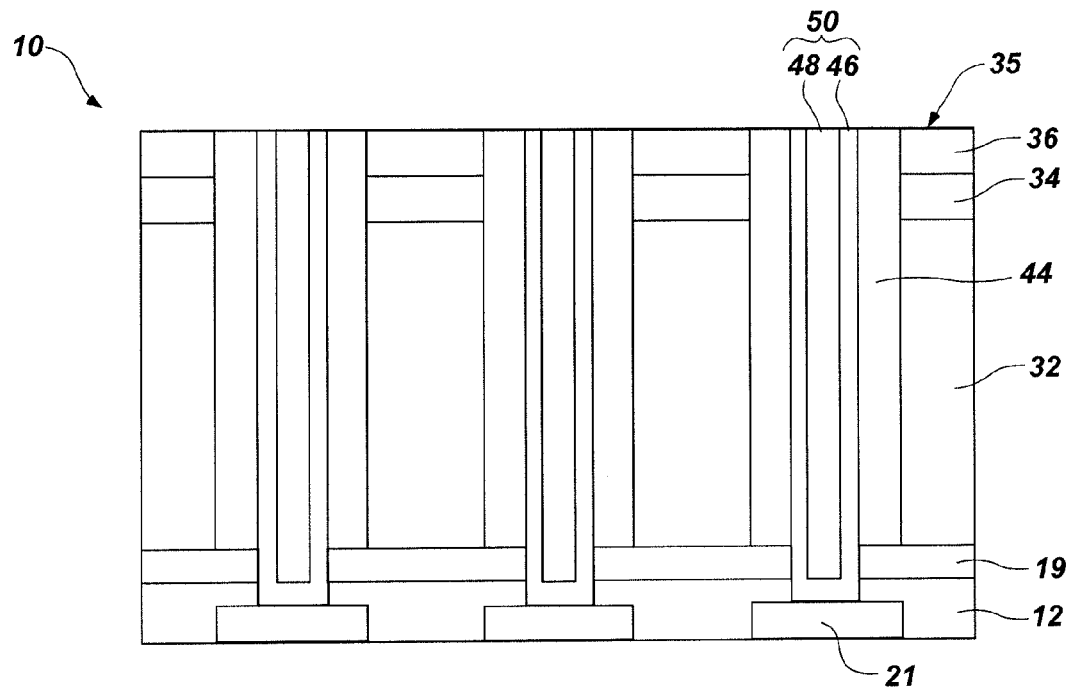

Referring to FIG. 7, the Ru material 46 and the conductive material 48 disposed on the exposed major surface 35 of the mask material 36 may be removed to electrically isolate the bottom electrode 50 of the capacitors being formed. Horizontal portions of the Ru material 46 and the conductive material 48 overlying the mask material 36 may be removed. For example, a planarization process may be used to remove the Ru material 46 and the conductive material 48 on and over the exposed major surface 35 of the mask material 36. In addition, the planarization process may expose a portion of the titanium nitride material 44 such that the bottom electrode 50, the titanium nitride material 44 and the mask material 36 are at least substantially planar. The semiconductor structure 10 may be planarized using a conventional planarization process, such as a chemical planarization process, a mechanical planarization process, a chemical-mechanical planarization (CMP) process, or a combination of any of the foregoing.

Figure 8:
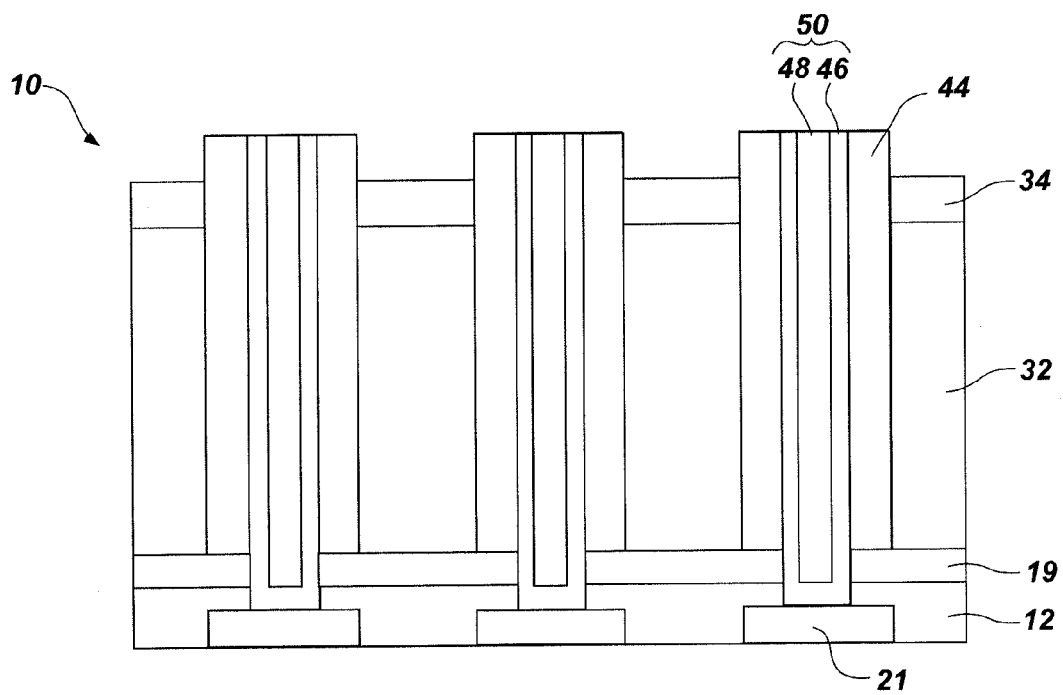
Figure 9:
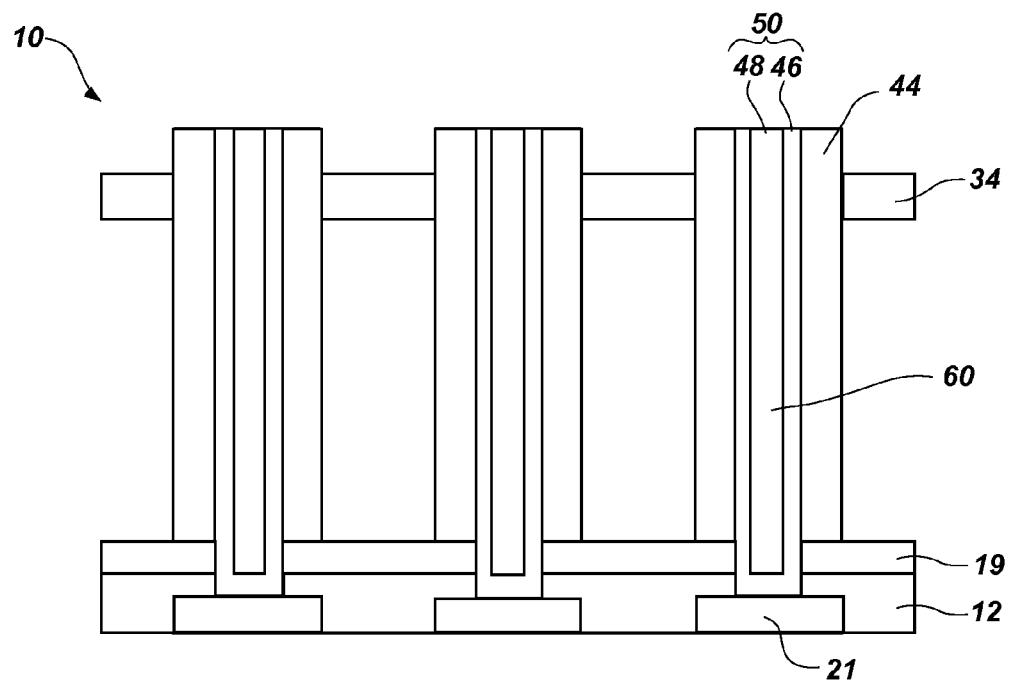

As shown in FIG. 8, the mask material 36 may be removed, such as by using a wet etch process, to expose the dielectric material 34. The support material 32 may then be removed from underneath the dielectric material 34 as shown in FIG. 9. The support material 32 may not be significantly exposed on any exterior surface of the semiconductor structure 10. Rather, at least one aperture (not shown and in a plane other than the cross-sectional view of FIG. 9) may be formed through the dielectric material 34 at selected locations to expose the underlying support material 32. An isotropic wet chemical etching process may be used to remove the support material 32 from between the dielectric material 34 and the substrate 12. By way of example, the support material 32 may be removed using an aqueous solution of tetramethylammonium hydroxide (TMAH) or ammonium hydroxide.

The etchant used may be selected such that the etchant will remove the support material 32 at a higher etch rate than any etch rate at which the etchant will remove the dielectric material 34. For example, if the support material 32 is a BPSG, the etchant may be relatively concentrated hydrofluoric acid (e.g., ten parts water to one part hydrofluoric acid (10:1 $H_2O$:HF)), and the dielectric material 34 may be a material that will not be removed by the concentrated hydrofluoric acid, or will be removed at significantly lower etch rates relative to the BPSG to enable the BPSG to be at least substantially removed from the semiconductor structure 10 without substantially removing the dielectric material 34. If the support material 32 is polysilicon, the etchant may be TMAH or ammonium hydroxide.

Removing the support material 32 from the semiconductor structure 10, as shown in FIG. 9, forms at least two longitudinally extending bottom electrodes 50 laterally surrounded by the titanium nitride material 44. A major longitudinal portion 60 or section of each of the bottom electrodes 50 may be laterally unsupported (e.g., no solid material surrounding the bottom electrodes 50). The dielectric material 34, however, may provide lateral support to the open upper end portions or sections of the titanium nitride material 44, which prevents the titanium nitride material 44 from leaning or tilting to the side and contacting adjacent bottom electrodes 50.

Figure 10:
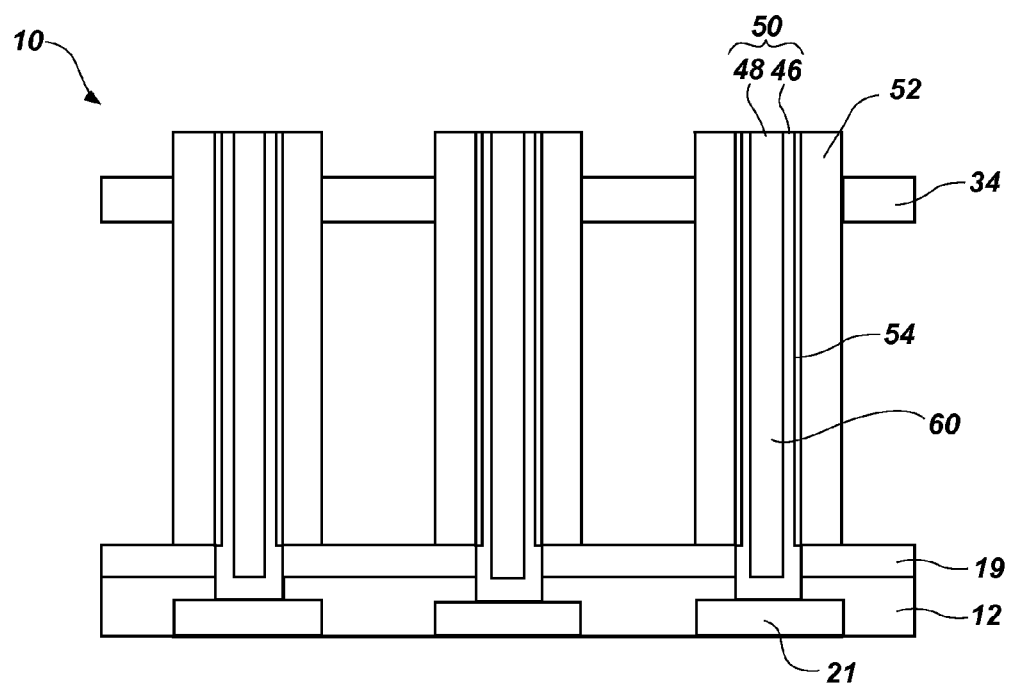

As shown in FIG. 10, at least a portion of the titanium nitride material 44 may be oxidized to form a rutile titanium dioxide ($TiO_2$) material 52. The semiconductor structure 10 may be exposed to an oxygen rich environment to oxidize a portion of the ruthenium material 46 to ruthenium dioxide and also oxidize the titanium nitride material 44 to titanium dioxide. For example, the semiconductor structure 10 may be exposed to an oxidant, such as at least one of oxygen ($O_2$), ozone ($O_3$), water ($H_2O$), nitrous oxide ($N_2O$) and nitric oxide (NO). In one embodiment, the oxidant is $O_2$. The oxidant may be substantially pure (e.g., greater than about 95% pure, greater than about 99% pure, or greater than about 99.9% pure), or may be mixed with an inert gas (e.g., argon, nitrogen). The exposure time of the semiconductor structure 10 to the oxygen rich environment may be controlled such that only a portion of the ruthenium material 46 is oxidized to a ruthenium dioxide material 54 while the titanium nitride material 44 is at least substantially converted to the rutile $TiO_2$ material 52. The ruthenium dioxide material 54 may have a thickness of from about 5 Å to about 10 Å. In one embodiment, the ruthenium dioxide material 54 is about 7 Å thick. During the oxidation, the semiconductor structure 10 may be heated to a temperature of, for example, from about 150° C. to about 450° C., such as from about 200° C. to about 400° C., or from about 250° C. to about 350° C. The semiconductor structure 10 may be heated in the presence of the oxidant for a time period of from about 30 seconds to about 60 minutes, such as a time period of from about 5 minutes to about 20 minutes.

Without being bound by a particular theory, it is believed that crystalline molecular sites on a surface of the ruthenium dioxide material 54 may guide titanium atoms into positions that correspond with the positions of titanium atoms in a rutile $TiO_2$ crystalline structure. With the initial titanium atoms in place for a rutile crystalline structure, the oxygen atoms may arrange in appropriate positions to continue growth of the rutile crystalline structure. In other words, the ruthenium dioxide material 54 may act as a template for forming the rutile $TiO_2$ material 52. Because the ruthenium dioxide material 54 has a crystal structure similar to a crystal structure of rutile $TiO_2$, the rutile $TiO_2$ material 52 may adopt the rutile crystal structure even at low temperatures. For example, the titanium nitride material 44 may be oxidized to form the rutile $TiO_2$ material 52 at temperatures less than about 600° C., such as from about 150° C. to about 600° C. or from about 150° C. to about 450° C. The titanium nitride material 44 may be oxidized using methods known in the art. For example, the titanium nitride material 44 may be oxidized by exposing the titanium nitride material 44 to oxygen or an oxygen containing compound such as oxygen ($O_2$), ambient air containing oxygen, or ozone ($O_3$). The exposure time of the titanium nitride material 44 to the oxygen or oxygen containing compound may be controlled such that a desired amount of the titanium nitride material 44 is converted to the rutile $TiO_2$ material 52. For example, the titanium nitride material 44 may be exposed to the oxygen or oxygen containing compound for a time from about one minute to about three hours. The temperature and exposure time for converting the titanium nitride material 44 to the rutile $TiO_2$ material 52 may be reduced by utilizing ozone rather than oxygen or another oxygen containing compound.

The rutile $TiO_2$ material 52 may be formed to a thickness of from about 30 Å to about 200 Å. The rutile $TiO_2$ material 52 may be formed to the desired thickness by converting the entire thickness of the titanium nitride material 44 to titanium dioxide as described above or, once an initial portion of rutile $TiO_2$ material 52 has been formed as described above, an additional portion of rutile $TiO_2$ material may be formed over the rutile $TiO_2$ material 52 using, for example, an ALD process, as known in the art.

Figure 11:
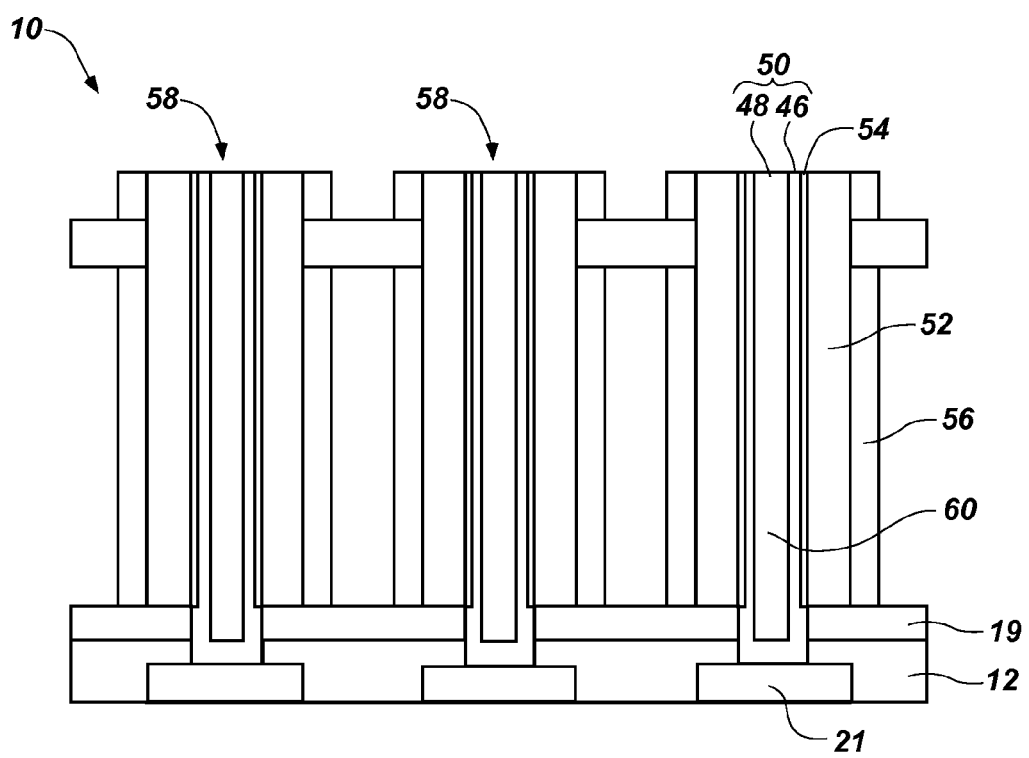

As shown in FIG. 11, another conductive material or top electrode 56 may be formed over exposed sidewalls of the rutile $TiO_2$ material 52. The top electrode 56, rutile $TiO_2$ material 52 and bottom electrode 50 form a capacitor 58. The top electrode 56 may be formed of any suitable conductive material including, but not limited to, metals, metal alloys, conductive metal oxides, and mixtures thereof. For example, the top electrode 56 may be formed of tungsten (W), nickel (Ni), tantalum nitride (TaN), platinum (Pt), tungsten nitride (WN), gold (Au), titanium nitride (TiN), titanium aluminum nitride (TiAlN), ruthenium (Ru), or ruthenium oxide ($RuO_2$). In some embodiments, the top electrode 56 may be formed of the same material as the conductive material 48 of the bottom electrode 50. The top electrode 56 may be formed by any process known in the art including, for example, ALD and CVD. The top electrode 56 may be planarized, as known in the art, to form a substantially planar surface with the rutile $TiO_2$ material 52 and the bottom electrode 50.

The capacitors 58 may have a substantially pillar-like shape as shown in FIG. 11. However, capacitors having different shapes and dimensions may also be achieved using embodiments of the methods as described herein. In some embodiments, the capacitors 58 may be cup or container capacitors. Because the capacitors 58 are formed with rutile $TiO_2$, which has a dielectric constant of about 170 along the c-axis of the crystal structure and about 90 along the a-axis of the crystal structure, the capacitors 58 may have sufficiently high capacitance for use in electronic devices. Additionally, the capacitors 58 may exhibit a low current leakage. Furthermore, because the capacitors 58 may be formed at relatively low temperatures, the capacitors 58 may be formed without damaging underlying devices on the substrate 12, such as the transistors 21.

By forming the Ru material 46 over the titanium nitride material 44, the Ru material 46 may be at least substantially prevented from reacting with the support material 32 (see FIG. 1). For example, in an embodiment where the support material 32 is a silicon material, such as polysilicon, the silicon material may react with Ru to form a ruthenium silicide material if the Ru and silicon material were in contact. In such a situation, if a substantial amount of the Ru material 46 were converted to ruthenium silicide (RuSi), then the rutile $TiO_2$ 52 formed over the Ru material 46 may not have the desired rutile crystalline structure. In addition, RuSi may exhibit a high current leakage at an interface between the rutile $TiO_2$ 52 and a bottom electrode 50 thereby decreasing an efficiency of the capacitor 58. In addition, the etchant used to remove the support material 32 as described above may etch the RuSi, which may weaken the bottom electrodes 50, which could, in turn, cause the capacitors 58 to wobble and also have a poor interface between the bottom electrodes 50 and the rutile $TiO_2$ 52. However, because the titanium nitride material 44 physically separates the Ru material 46 and the support material 32 in embodiments of the present disclosure, the Ru material 46 will not react with the support material 32, the capacitor 58 or semiconductor structure 10 is at least substantially free of ruthenium silicide, and the problems associated with RuSi are avoided.

CONCLUSION

In some embodiments, the present disclosure includes a capacitor including a first electrode comprising a conductive material laterally surrounded by a ruthenium material, the ruthenium material comprising a ruthenium oxide on an outer surface thereof, a rutile titanium dioxide material laterally surrounding the first electrode, and a second electrode laterally surrounding the rutile titanium dioxide material.

Other embodiments include semiconductor devices incorporating such capacitors. Such semiconductor devices may include at least one capacitor. The at least one capacitor includes a first electrode wherein at least a portion of the first electrode includes a ruthenium material. A ruthenium oxide material is laterally adjacent the first electrode, a rutile titanium dioxide material is laterally adjacent the ruthenium oxide material, and a second electrode is laterally adjacent the rutile titanium dioxide material.

In additional embodiments, the present disclosure includes methods of forming a capacitor. The methods include forming at least one aperture in a support material, forming a titanium nitride material within the at least one aperture, forming a ruthenium material within the at least one aperture over the titanium nitride material, and forming a first conductive material over the ruthenium material within the at least one aperture. The support material may then be removed and the titanium nitride material may be oxidized to form a titanium dioxide material. A second conductive material may then be formed over an outer surface of the titanium dioxide material.

In further embodiments, the present disclosure includes methods of a semiconductor device. The methods include forming at least one recess through a dielectric material and a support material extending over a substrate. A titanium nitride material may be formed on exposed surfaces of the support material and the dielectric material within the at least one recess. A ruthenium material may be formed over the titanium nitride material within the at least one recess and a first conductive material may be formed over the titanium nitride material within the at least one recess. The support material may be removed from between the dielectric material and the substrate. The ruthenium material and the titanium nitride material may then be oxidized to form a ruthenium oxide having a rutile titanium dioxide material thereon. A second conductive material may be formed over the rutile titanium dioxide material.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention encompasses all modifications, variations and alternatives falling within the scope of the invention as defined by the following appended claims and their legal equivalents.

What is claimed is:

1. A method of forming a capacitor, comprising:
    forming at least one aperture in a support material;
    forming a titanium nitride material within the at least one aperture;
    forming a ruthenium material within the at least one aperture over the titanium nitride material;
    forming a first conductive material over the ruthenium material within the at least one aperture;
    removing the support material;
    oxidizing the titanium nitride material to form a titanium dioxide material; and
    forming a second conductive material over an outer surface of the titanium dioxide material.

2. The method of claim 1, wherein oxidizing the titanium nitride material to form a titanium dioxide material comprises forming a rutile titanium dioxide material.

3. The method of claim 2, wherein forming a rutile titanium dioxide material comprises oxidizing a portion of the ruthenium material to form a ruthenium oxide material and forming the rutile titanium dioxide material on the ruthenium oxide material.

4. The method of claim 1, further comprising laterally supporting at least a portion of an open end of the titanium nitride material, the ruthenium material and the first conductive material with a dielectric material.

5. The method of claim 4, wherein removing the support material comprises:
    forming at least one aperture in the dielectric material and exposing the support material through the at least one aperture in the dielectric material; and
    etching the support material through the at least one aperture in the dielectric material.

6. The method of claim 1, wherein oxidizing the titanium nitride material to form a titanium dioxide material comprises exposing the titanium nitride material to an oxygen-rich environment.

7. The method of claim 6, wherein exposing the titanium nitride material to an oxygen-rich environment comprises exposing the titanium nitride material to at least one of oxygen, ozone, water, nitrous oxide and nitric oxide.

8. The method of claim 1, wherein oxidizing the titanium nitride material to form a titanium dioxide material comprises forming a rutile titanium dioxide material at a temperature less than about 600° C.

9. The method of claim 1, wherein forming a ruthenium material within the at least one aperture over the titanium nitride material comprises forming the ruthenium material in direct contact with the titanium nitride material.

10. The method of claim 1, wherein forming a ruthenium material within the at least one aperture over the titanium nitride material comprises forming a ruthenium material having a thickness of from about five angstroms to about ten angstroms.

11. The method of claim 1, further comprising forming additional titanium dioxide by an atomic layer deposition process over the titanium dioxide material.

12. A method of forming a semiconductor device, comprising:
    forming at least one recess through a dielectric material and a support material extending over a substrate;
    forming a titanium nitride material on exposed surfaces of the support material and the dielectric material within the at least one recess;
    forming a ruthenium material over the titanium nitride material within the at least one recess;
    forming a first conductive material over the titanium nitride material within the at least one recess;
    removing the support material from between the dielectric material and the substrate;
    oxidizing the ruthenium material and the titanium nitride material to form a ruthenium oxide having a rutile titanium dioxide material thereon; and
    forming a second conductive material over the rutile titanium dioxide material.

13. The method of claim 12, further comprising etching a portion of the titanium nitride material at a bottom of the at least one recess to expose at least one transistor formed over the substrate.

14. The method of claim 13, wherein forming a ruthenium material over the titanium nitride material within the at least one recess comprises forming the ruthenium material in electrical communication with the at least one transistor.

15. The method of claim 12, further comprising orientating the first conductive material, the ruthenium material, the rutile titanium dioxide material and the second conductive material to extend longitudinally perpendicular to a generally planar surface of the substrate.

16. The method of claim 12, wherein forming at least one recess through a dielectric material and a support material extending over a substrate comprises forming the at least one recess through a silicon nitride material and polysilicon.

17. A method of forming a capacitor, comprising:
    forming rutile titanium dioxide laterally surrounding a first electrode comprising a conductive material, ruthenium, and ruthenium oxide;
    forming a second electrode laterally surrounding the rutile titanium dioxide; and
    forming a dielectric material at least partially laterally surrounding an upper end portion of the rutile titanium dioxide.

18. The method of claim 17, wherein forming a dielectric material at least partially laterally surrounding an upper end portion of the rutile titanium dioxide comprises forming a nitride material at least partially laterally surrounding the upper end portion of the rutile titanium dioxide.

19. The method of claim 17, further comprising forming the first electrode substantially free of ruthenium silicide.

20. The method of claim 17, wherein forming rutile titanium dioxide laterally surrounding a first electrode comprises forming rutile titanium dioxide having a thickness of from about five angstroms to about ten angstroms.

21. The method of claim 17, further comprising forming the first electrode comprising the conductive material, the ruthenium laterally surrounding the conductive material, and the ruthenium oxide on an outer surface of the ruthenium.

* * * * *